(12) United States Patent
Kim

(10) Patent No.: US 6,179,190 B1
(45) Date of Patent: Jan. 30, 2001

(54) TAPE FEEDER OF CHIP MOUNTER

(75) Inventor: Young-il Kim, Kyungki-do (KR)

(73) Assignee: Samsung Aerospace Insustries, Ltd., Kyungki-do (KR)

( * ) Notice: Under 35 U.S.C. 154(b), the term of this patent shall be extended for 0 days.

(21) Appl. No.: 09/221,162

(22) Filed: Dec. 28, 1998

(30) Foreign Application Priority Data

Dec. 29, 1997 (KR) .................................................. 97-42185
Dec. 31, 1997 (KR) .................................................. 97-82090
Nov. 4, 1998 (KR) .................................................. 98-21368

(51) Int. Cl.[7] .................................................. B65H 18/18
(52) U.S. Cl. .................... 226/115; 226/147; 226/145; 226/151
(58) Field of Search ................. 242/538, 538.2; 226/109, 115, 145, 147, 151, 148, 157

(56) References Cited

U.S. PATENT DOCUMENTS

| | | | |
|---|---|---|---|
| 1,309,420 | * 7/1919 | Schroeder | 226/147 |
| 4,620,655 | * 11/1986 | Fujita | 226/109 |
| 4,735,341 | * 4/1988 | Hamilton et al. | 221/1 |
| 4,943,342 | * 7/1990 | Golemon | 156/584 |
| 5,116,454 | * 5/1992 | Kurihara | 156/584 |
| 5,282,659 | * 2/1994 | Yasuraoka et al. | 294/2 |
| 5,310,301 | * 5/1994 | Aono | 414/416 |
| 5,419,802 | * 5/1995 | Nakatsuka et al. | 1/73 |
| 5,531,859 | 7/1996 | Lee et al. . | |
| 6,082,603 | * 7/2000 | Takada et al. | 226/157 |

* cited by examiner

Primary Examiner—Donald P. Walsh
Assistant Examiner—Collin A. Webb
(74) Attorney, Agent, or Firm—Finnegan, Henderson, Farabow, Garrett, & Dunner, L.L.P.

(57) ABSTRACT

A tape feeder of a chip mounter including a frame, a transfer wheel rotatably installed on the frame, for intermittently transferring a chip tape by a predetermined length, a wheel member rotatably installed on the frame, a reel installed coaxially with the wheel member, for winding a cover tape separated from the chip tape, driving means for intermittently rotating the transfer wheel and the wheel member a predetermined amount in one direction, and a reverse rotation prevention member for preventing reverse rotation of the wheel member or the reel by frictionally contacting either the wheel member or the reel.

17 Claims, 7 Drawing Sheets

TAPE FEEDER OF CHIP MOUNTER

BACKGROUND OF THE INVENTION

1. Field of the Invention

The present invention relates to a tape feeder of a chip mounter, and more particularly, to a tape feeder in a chip mounter, which peels off a cover tape while transferring a chip mounter tape by a predetermined length and discharges or winds the peeled cover tape.

2. Description of the Related Art

Figure 1:
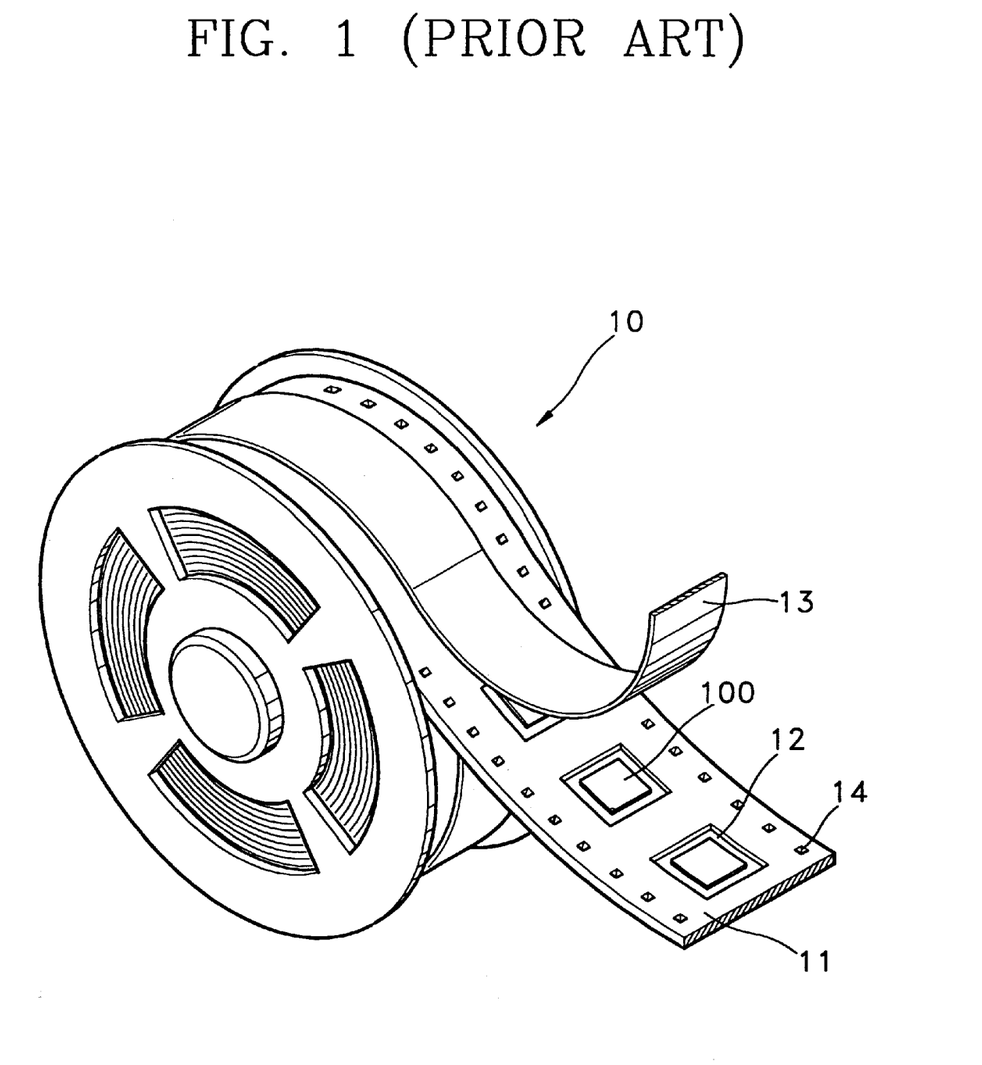
FIG. 1 is a perspective view of a chip tape used in a typical chip mounter.

Electronic parts such as semiconductor chip are difficult to treat piece by piece, and are prone to contamination by foreign matters such as dust. As shown in FIG. 1, chips 100 are handled by being packed in tapes. That is, the chips 100 are put in receiving spaces 12 formed apart from each other on a base tape 11, and sealed by a cover tape 13, thereby forming a chip tape 10.

The chip tape 10 is provided by a tape feeder (not shown) installed on a chip mounter for mounting the chips 100, for example, on a printed circuit board. That is, while the chip tape 10 is intermittently supplied by a predetermined length from the tape feeder, the base tape 11 and the cover tape 13 are separated from each other. Then, a chuck (not shown) provided in the chip mounter picks up the chips 100 from the receiving spaces 12.

The tape feeder, separating the cover tape 13 of the chip tape 10 from the base tape 11, winds the separated cover tape 13 on a reel or expels it to the outside.

An exemplary tape feeder of a chip mounter, which winds the separated cover tape on a reel is disclosed in U.S. Pat. No. 5,531,859. The tape feeder includes a transfer means for intermittently transferring the tape by a predetermined length from the feeder to a position to be mounted; means simultaneously operating with the transferring means for winding a cover tape from the tape; a shuttle road for connecting the winding means to the transferring means; and an actuator for reciprocating the shuttle road to drive the winding means and the transferring means. Here, the winding means includes a take up reel assembly and a planetary gear connected to a shaft interlocking with the take up reel assembly to rotate in only one direction.

Such an electronic part feeder requires to separate employment of a take up reel for winding the cover tape and a means for intermittently driving the take up reel, such that the structure of the feeder is relatively complicated.

Figure 2:
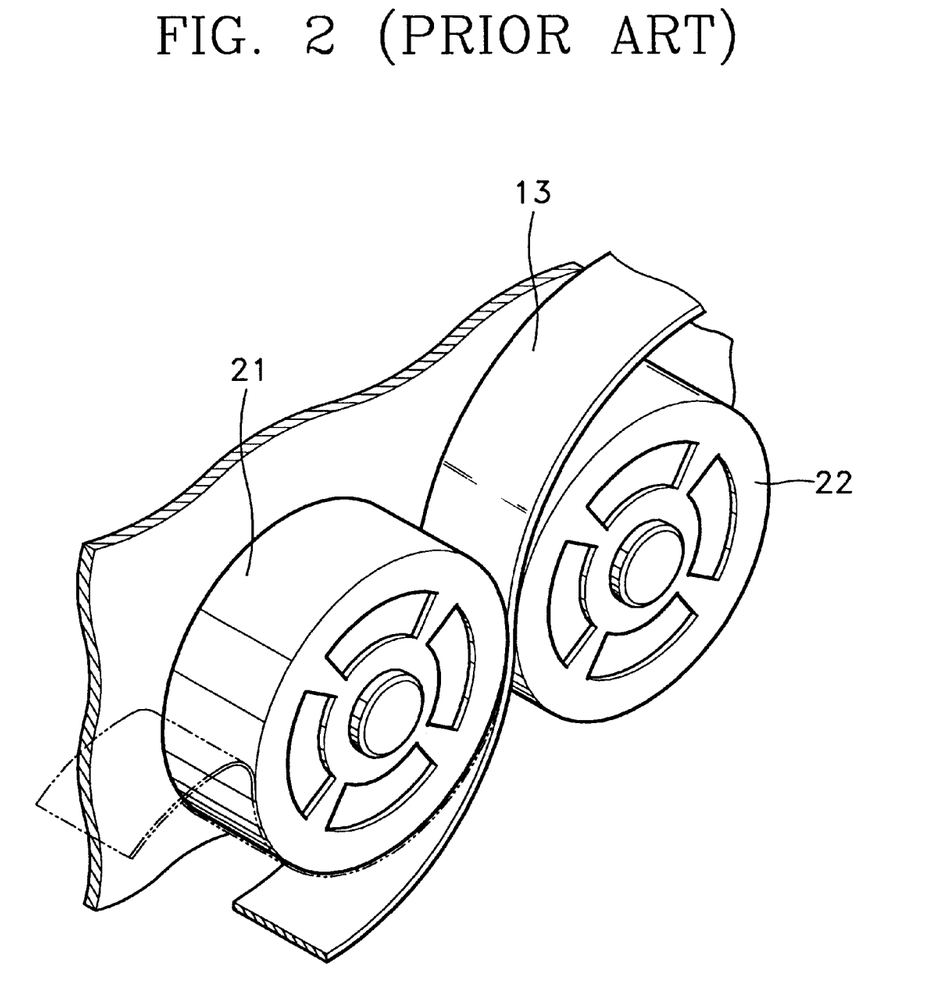
FIG. 2 is a perspective view of a cover tape discharging device adopted in a conventional chip tape feeder.

FIG. 2 shows a conventional tape feeder that adopts a method of expelling a peeled cover tape to the outside.

Referring to FIG. 2, a pair of wheels 21 and 22 closely connected to each other are rotated intermittently by a driving means (not shown), so that a cover tape 13 sandwiched between the two wheels is expelled to the outside. The cover tape 13 is transferred by friction between the two wheels 21 and 22, and accordingly when an adhesive remains on the cover tape 13, it may be attached to and wound on the outer circumferential surface of the wheel without being smoothly discharged to the outside.

Also, the cover tape 13 has an irregular travel path, and easily deviates from an accurate contact portion between the wheels 21 and 22. Thus, the cover tape 13 may be escaped from the wheels 21 and 22.

SUMMARY OF THE INVENTION

To solve the above problems, it is an exemplary objective of the present invention to provide a tape feeder of a chip mounter, which has a simple structure of winding a cover tape on a reel or discharging the cover tape to the outside, and operates with reliability.

Accordingly, there is provided a tape feeder of a chip mounter comprising: a frame; a wheel member rotatably installed on the frame; a reel installed coaxially with the wheel member, for winding a cover tape; driving means for intermittently rotating the wheel member a predetermined amount in one direction; and a reverse rotation prevention member frictionally in contact with the wheel member, for preventing reverse rotation of the wheel member.

It is preferable that the reverse rotation prevention member has one end pivotally installed on the frame and the other end on which a curved friction surface contacting the outer circumference of the wheel member is formed, and the radius of the curved friction surface gradually increases in the direction of rotation of the wheel member.

According to another embodiment of the present invention, the reverse rotation prevention member comprises: a pivot lever whose one end is pivotally supported by the frame; a friction wheel which is installed on the other end of the pivot lever so as to contact the wheel member and rotates in only a direction that is reverse to the direction of rotation of the wheel member; and a spring for elastically biasing the pivot lever so that the friction wheel can contact the wheel member.

According to another aspect of the present invention, there is provided a tape feeder of a chip mounter comprising: a frame; a transfer wheel rotatably installed on the frame, for intermittently transferring a chip tape by a predetermined length; a wheel member rotatably installed on the frame; a reel installed coaxially with the wheel member, for winding a cover tape separated from the chip tape; driving means for intermittently rotating the transfer wheel and the wheel member a predetermined amount in one direction; and a reverse rotation prevention member for preventing reverse rotation of the wheel member or the reel by frictionally contacting either the wheel member or the reel.

Here, the driving means comprises: an actuator; a first link whose one end is connected to the actuator and the other end is pivotally coupled to the frame, and on which a cam portion is formed; a second link having a center rotatably coupled to the frame, and one end on which a cam follower interlocked with the cam portion is installed; a first latched pawl which is pivotally installed on the other end of the second link and elastically biased so that one end of the first latched pawl can mesh with the teeth of the transfer wheel; and a power switch unit interlocking with the pivoting of the second link for intermittently rotating the wheel member a predetermined amount.

According to still another aspect of the present invention, there is provided a tape feeder of a chip mounter comprising: a frame; a transfer wheel rotatably installed on the frame, for intermittently transferring a chip tape by a predetermined length; a driven wheel rotatably installed on the frame; a discharge wheel installed coaxially with the driven wheel; a driving wheel installed so as to contact the outer circumferential surface of the driven wheel, for intermittently rotating the driven wheel a predetermined amount of rotation in only one direction; a pressure wheel installed so as to closely contact the outer circumferential surface of the discharge wheel, with a cover tape, separated from the chip tape, sandwiched between the pressure wheel and the discharge wheel, for discharging the cover tape due to the rotation; and driving means for intermittently rotating the transfer wheel and the driving wheel a predetermined amount respectively in one direction.

BRIEF DESCRIPTION OF THE DRAWINGS

The above exemplary aspects objectives and advantages of the present invention will become more apparent by describing in detail preferred embodiments thereof with reference to the attached drawings in which.

DESCRIPTION OF THE PREFERRED EMBODIMENTS

A tape feeder of a chip mounter according to the present invention peels off a cover tape while intermittently transferring a chip tape containing chips. An embodiment of the tape feeder according to the present invention is shown in FIG. 3.

Figure 3:
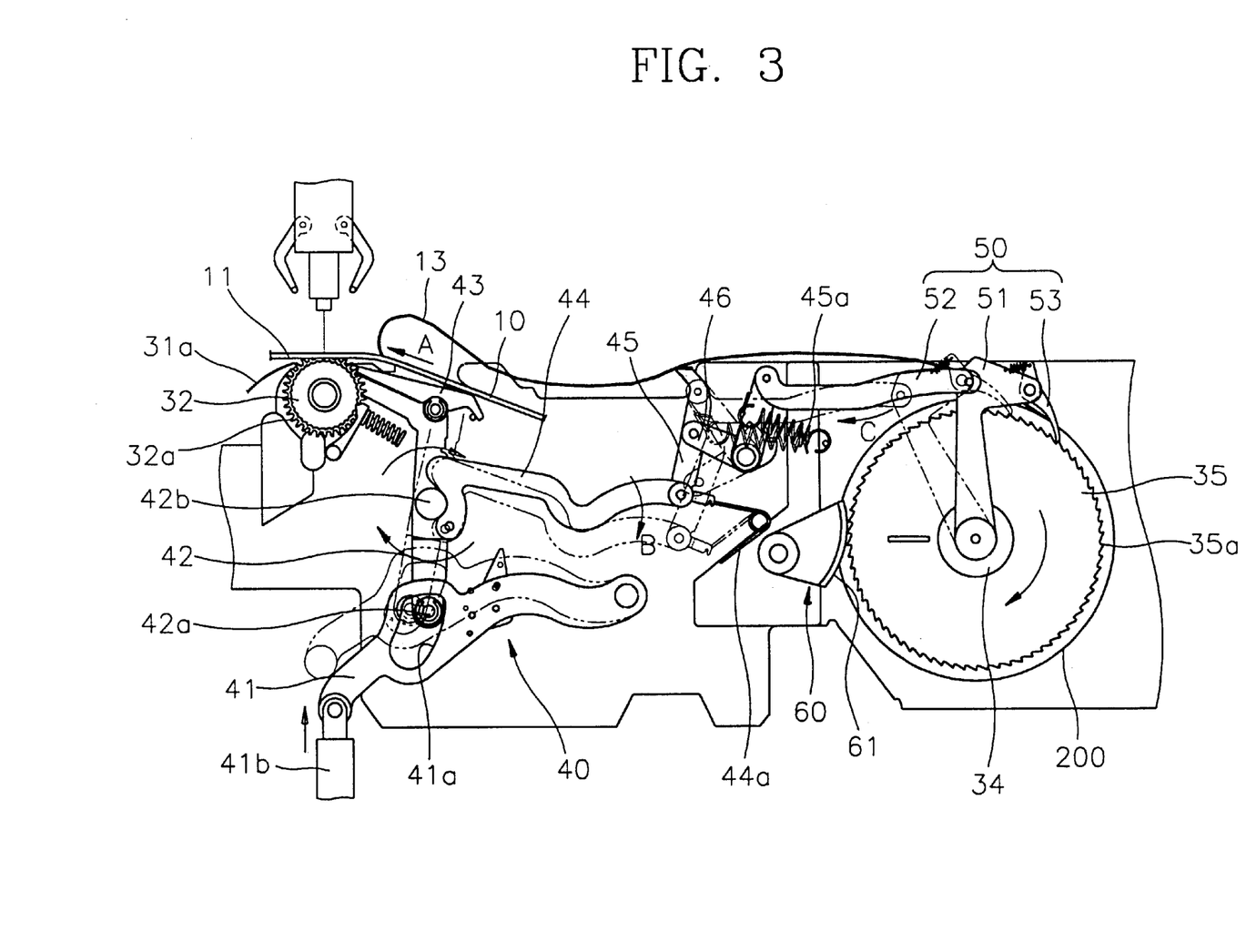
FIG. 3 is a side view of a tape feeder of a chip mounter according to an embodiment of the present invention.

Referring to FIG. 3, a transfer wheel 32, for intermittently transferring a base tape 11 (see FIG. 1) by a predetermined length by interlocking the teeth of the transfer wheel with the transfer holes 14 (see FIG. 1) of the base tape 11, is installed on one side of a frame 31. A wheel member 35, combined with a reel 200 on which a cover tape 13 separated from the base tape 11 is wound, is installed on the other side of the frame 31, so as to rotate in one direction. The transfer wheel 32 and the wheel member 35 are intermittently rotated a predetermined amount by a driving means.

The transfer wheel 32 can use a latched wheel or sprocket having an outer circumferential surface on which teeth 32a are formed. The reel 200 on which the cover tape 13 is wound is prevented from being reversely rotated, by a reverse rotation prevention member 60. A guide unit 31a for guiding the traveling of a chip tape 10 is installed on one side of the transfer wheel 32.

The driving means includes a first link 41, a second link 42, and a first latched pawl 43. The first link 41 has one end pivotally combined with the frame 31, and has a cam portion 41a formed therein. The second link 42 has a center rotatably combined with the frame 31, and one end on which a cam follower 42a interlocked with the cam portion 41a is formed. The first latched pawl 43 is pivotally installed on the other end of the second link 42, and is elastically biased so that one end of the pawl 43 meshes with the teeth 32a of the transfer wheel 32.

The free end of the first link 41 is driven by an actuator 41b. An air pressure cylinder or a motor mounted with an eccentric cam or any type of the actuator can be used.

One end of a third link 44 is fixed to the second link 42, and the other end thereof is connected to a fourth link 45. The fourth link 45 is combined with one end of a fifth link 46, which is V-shaped and has a center pivotally installed on the frame 31. The other end of the fifth link 46 is coupled to a power switch unit 50.

Figure 4:
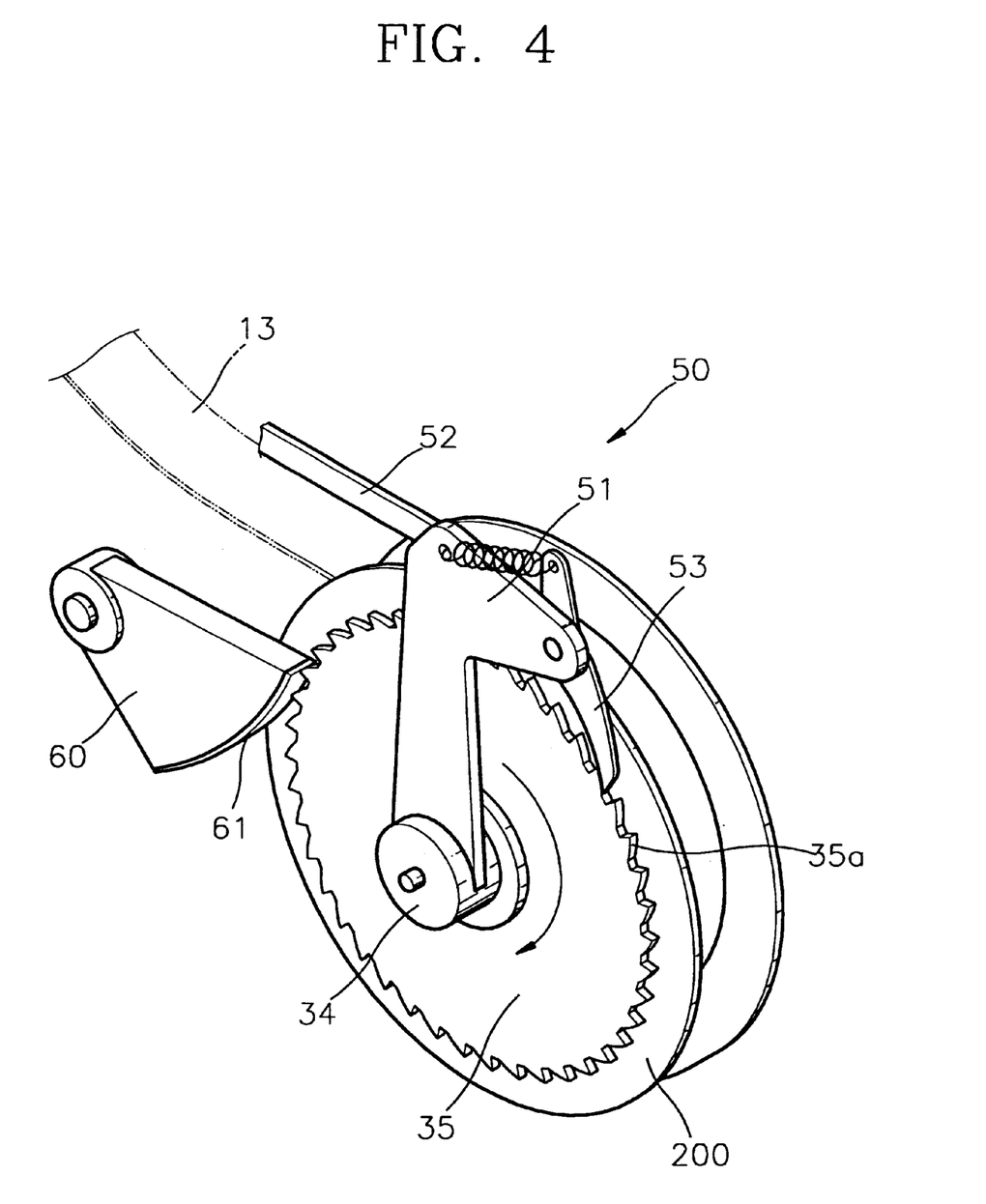
FIG. 4 is a perspective view of the power switch unit and the reverse rotation prevention member shown in FIG. 3.

The power switch unit 50 rotates the wheel member 35 by predetermined angles, and, as shown in FIGS. 3 and 4, is comprised of a pivot link 51 coupled to a shaft 34 of the wheel member 35, a sixth link 52 connecting the free end of the pivot link 51 to the other end of the fifth link 46, and a second latched pawl 53 installed on the free end of the pivot link 51 and engaged with teeth 35a on the circumference of the wheel member 35.

The other end of the fifth link 46 is connected to a spring 45a fixed to the frame, and is elastically biased. A torsion spring 44a is also installed in the end of the third link 44, and biased.

The reverse rotation prevention member 60, for preventing reverse rotation of the reel 200 on which the cover tape 13 is to be wound, has one end pivotally installed on one side of the reel 200, and the other free end on which a curved friction surface 61 contacting the wheel member 35 is formed. The curved friction surface 61 has progressively increasing diameters in the direction of rotation of the wheel member 35. A rubber padding is attached on the curved friction surface 61 or rubber is coated thereon to improve the frictional force of the curved friction surface 61. Also, teeth can be formed on the curved friction surfce 61.

The operation of the tape feeder having such a configuration according to the embodiment of the present invention will now be described referring to FIGS. 3 and 4.

The free end of the first link 41 is lifted by the driving of the actuator 41b to supply the chip mount tape 10 in a direction indicated by arrow A. Then, the cam follower 42a installed on one end of the second link 42 moves along the cam portion 41a, so that the second link 42 rotates clockwise around a hinge pivot 42b. Here, the first latched pawl 43 installed on the other end of the second link 42 retreats along the teeth 32a of the transfer wheel 32.

The rotation of the second link 42 allows the third link 44 to move in a direction indicated by arrow B. The movement of the third link 44 is transmitted to the sixth link 52 via the fourth and fifth links 45 and 46, and allows the sixth link 53 to move in a direction indicated by arrow C.

Accordingly, the pivot link 51 of the power switch unit 50 pivots counterclockwise around the shaft 34 of the wheel member 35, and the second latched pawl 52 installed on the free end of the pivot link 51 retreats while sliding along the teeth 35a of the wheel member 35. Here, counterclockwise reverse rotation of the wheel member 35 or the reel 200 is prevented by the reverse rotation prevention member 60. That is, the diameter of the curved friction surface 61, at a contact portion between the reverse rotation prevention member 60 and the wheel member 35, becomes larger as the reel 200 or the wheel member 35 rotates counterclockwise, so that the reverse rotation of the wheel member 35 and the reel 200 is prevented.

In this state, when the actuator 41b is restored and a driving force is thus removed, the second link 42 rotates counterclockwise different than before, due to the restoring force of the torsion spring 44a installed on the end of the third link 44 and the restoring force of the spring 45a installed between the fifth link 46 and the frame 31. Thus, the first latched pawl 43 rotates the transfer wheel 32 while proceeding in engagement with the teeth 32a of the transfer wheel 32, thereby transferring the chip tape 10.

Simultaneously, the sixth link 52 rotates the pivot link 51 clockwise while moving in the direction indicated by arrow C. Thus, the wheel member 35, engaged with the second latched pawl 53 installed on the free end of the pivot link 51, rotates counterclockwise.

When the wheel member 35 or the reel 200 rotates clockwise, the curved friction surface 61, having a small radius, of the reverse rotation prevention member 60 contacts the wheel member 35, to thus release the reel 200 from its latched state.

Through the above-described operation, the chip tape 10 (see FIG. 1) is supplied in the direction indicated by arrow A, and simultaneously, the cover tape 13 separated from the chip tape 10 is wound on the reel 200.

The configurations of the power switch unit and the reverse rotation prevention member are not limited to the present embodiments. That is, the power switch unit can have any structure in which the wheel member 35 and the reel 200 can be rotated by predetermined angles using the power of the actuator 41b, and the reverse rotation prevention member can have any structure which prevents reverse rotation of the wheel member or the reel.

Figure 5:
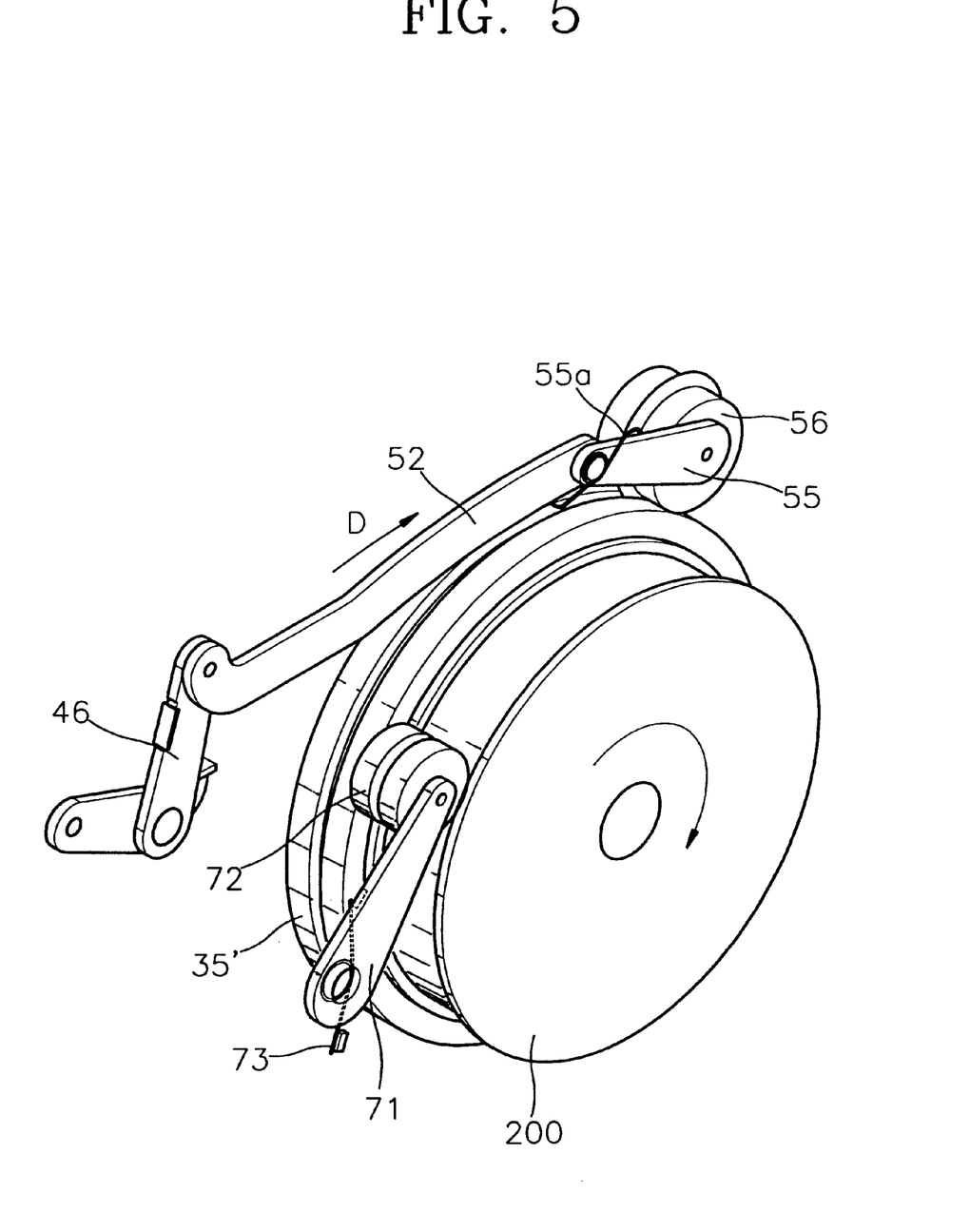
FIG. 5 is a side view of another example of the power switch unit and the reverse rotation prevention member of FIG. 4.

Another example of the power switch unit and the reverse rotation prevention member is shown in FIG. 5.

As shown in FIG. 5, one end of an auxiliary link 55 is coupled to the end of the sixth link 52, and a driving wheel 56 rotating in one direction is installed on the other end of the auxiliary link 55. Preferably, the driving wheel 56 is supported by a one-way clutch (not shown) to rotate counterclockwise only.

A torsion spring 55a is installed on a connection portion between the sixth link 52 and the auxiliary link 55, to strongly and elastically bias the driving wheel 56 toward the outer circumferential surface of the wheel member 35'. The outer circumferential surface of the wheel member 35' is curved without teeth and thus frictionally contacts the driving wheel 56. The driving wheel and the wheel member can be comprised of a gear.

In the reverse rotation prevention member of the present embodiment, a pivot lever 71 is rotatably coupled to one side of the wheel member 35', and a friction wheel 72 is installed on the free end of the pivot level 71 so as to rotate in only one direction (counterclockwise). The pivot level 71 is elastically biased by a torsion spring 73 so that the friction wheel 72 can contact the wheel member 35' or the reel 200. The friction wheel 72 can be configured as described above by the one-way clutch.

In the operation of the reverse rotation prevention member in a tape feeder employing the power switch unit of FIG. 4, when the second latched pawl 53 retreats by the pivoting of the pivot link 51, the friction wheel 72 does not rotate counterclockwise, thus preventing reverse rotation of the wheel member 35. On the other hand, when the second latched pawl 53 advances by the pivoting of the pivot link 51, the friction wheel 72 can rotate clockwise.

In the power switch unit, when the sixth link 52 and the auxiliary link 55 advance in a direction indicated by arrow D, the driving wheel 56 does not rotate clockwise, so that the wheel member 35' is rotated clockwise by the frictional force between the driving wheel 56 and the wheel member 35'. On the other hand, when the sixth link 52 and the auxiliary link 55 retreat, the driving wheel 56 rotates counterclockwise, so that rotation of the wheel member 35' is prevented by the friction wheel 72.

Figure 6:
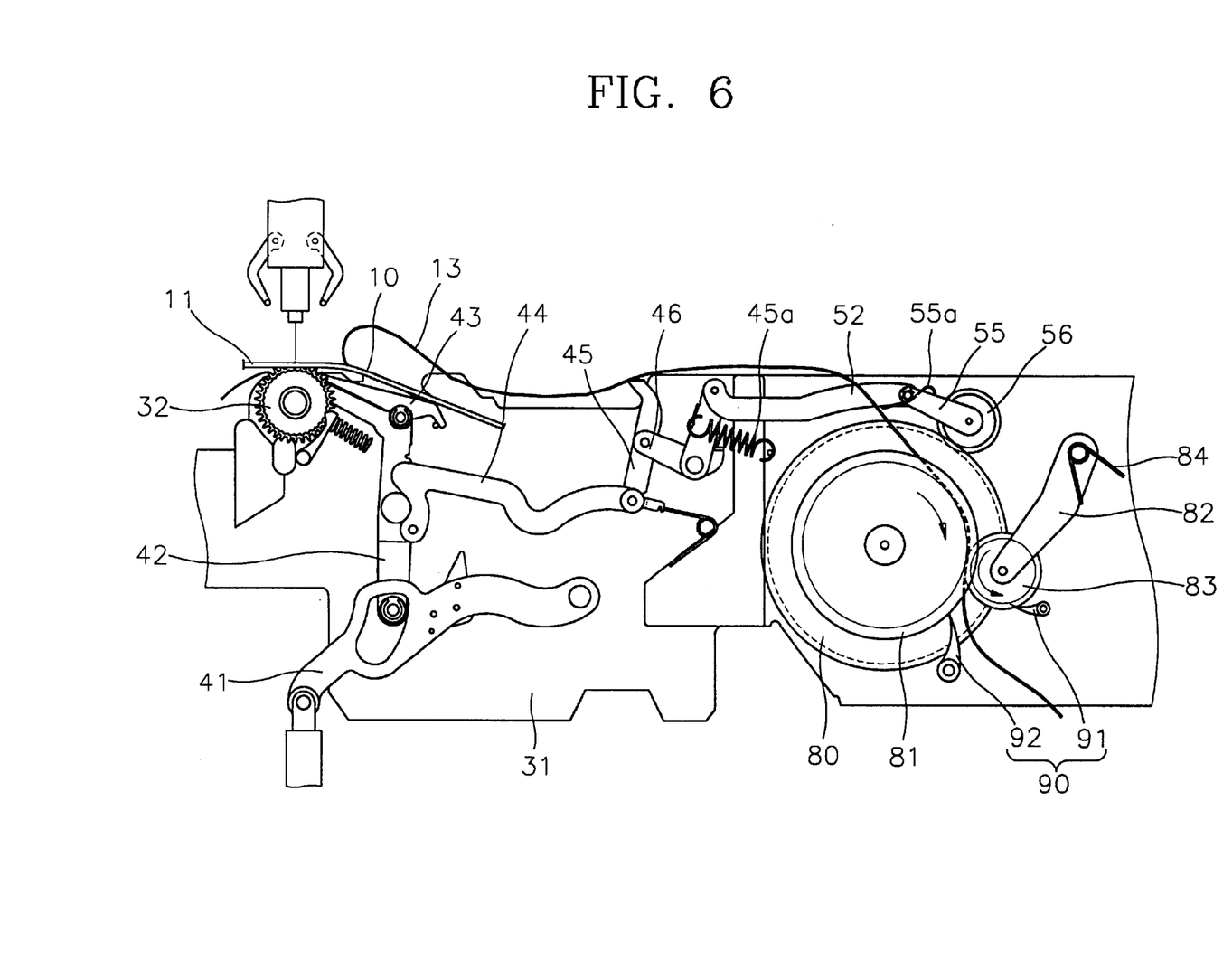
FIG. 6 is a side view of a tape feeder of a chip mounter according to another embodiment of the present invention.
Figure 7:
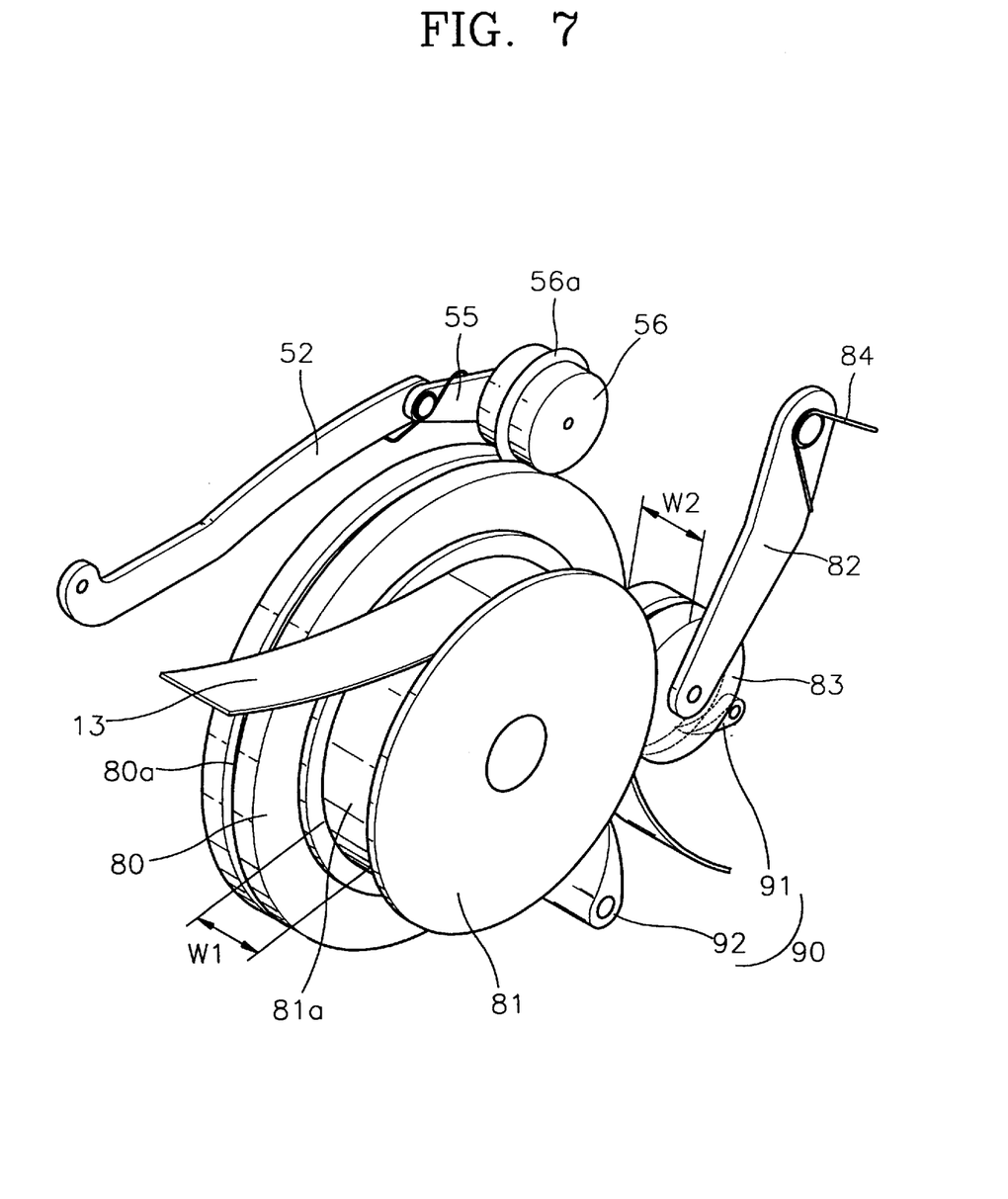
FIG. 7 is a perspective view of the power switch unit and the cover tape discharging unit shown in FIG. 6.

A tape feeder of a chip mounter according to another embodiment of the present invention is shown in FIGS. 6 and 7. Here, the same reference numerals as the previous drawings denote the same elements.

The tape feeder according to the present embodiment is provided with a discharge means for expelling the cover tape 13 separated from the chip tape 10 to the outside. The discharge means includes a driven wheel 80 rotating in frictional contact with the driving wheel 56, a discharge wheel 81 which is installed coaxially with the driven wheel 80 and rotates, and a pressure wheel 83 which closely contacts the outer circumferential surface of the discharge wheel 81. Here, the cover tape 13 is sandwiched between the pressure wheel 83 and the discharge wheel 81.

The driven wheel 80 is intermittently rotated clockwise by the driving wheel 56 as described in the previous embodiment. In order to improve the frictional force between the driving wheel 56 and the driven wheel 80 and stabilize the running track for the two wheels, it is preferable that a groove 80a is formed on the outer circumferential surface of one wheel of the two, and a protrusion 56a, to be inserted into the groove 80a, is formed on the outer circumferential surface of the other wheel. Here, the driving wheel and the driven wheel can be formed of a gear.

A flange 81a is formed along the outer circumferential edge of the discharge wheel 81, such that the pressure wheel 83 inserts into the flange 81a. Therefore, the flange 81a can prevent the cover tape 13 between the discharge wheel 81 and the pressure wheel 83 from escaping from its normal track. Preferably, the width W2 of the pressure wheel 83 is the same as the internal width W1 of the discharge wheel 81.

The pressure wheel 83 is supported by one end of a pivot member 82, and can only rotate counterclockwise, thus preventing reverse rotation of the driven wheel 80 and the discharge wheel 81. Here, the driven wheel 80 may only rotate counterclockwise to improve the function of preventing reverse rotation of the driven wheel 80. The pivot member 82 is elastically biased by a torsion spring 84 so that the pressure wheel 83 can closely contact the discharge wheel 81. Also, it is preferable that a friction member such as rubber is coated on the outer circumferential surface of the wheels to increase the frictional force between the wheels.

According to the present embodiment, a winding prevention means 90 for preventing the cover tape 13 from being attached to and wound on the outer circumferential surface of the discharge wheel 81 or the pressure wheel 83 is further provided. The winding prevention means 90 is comprised of scrappers 91 and 92 pivotally installed so as to closely contact respectively the outer circumferential surfaces of the discharge wheel 81 and the pressure wheel 83. The scrapers 91 and 92 are elastically biased by a pressure means such as a spring (not shown) so as to closely contact the outer circumferential surface of the discharge wheel 81 or the pressure wheel 83.

In the operation of the tape feeder of the chip mounter according to the present invention having such a configuration, when the auxiliary link 55 retreats in the same manner as in the above-described embodiments, the driving wheel 56 on the end of the auxiliary link 55 retreats along the outer circumferential surface of the driven wheel 80 while rotating counterclockwise. At this time, the discharge wheel 81 contacts closely the pressure wheel 83 which does not rotate clockwise, so that the driven wheel 80 and the discharge wheel 81 are not rotated.

When the auxiliary link 55 advances in the same manner as in the above-described embodiment, the driving wheel 56 advances in contact with the outer circumferential surface of the driven wheel 80. At this time, since the driving wheel 56 does not rotate clockwise, the driven wheel 80 rotates clockwise due to the frictional force with the driving wheel 56. The rotation of the discharge wheel 81 is not disturbed because the pressure wheel 83 can also rotate counterclockwise. Accordingly, the cover tape 13 interposed between the discharge wheel 81 and the pressure wheel 83 can be discharged.

When the cover tape 13 is attached to the pressure wheel 83 or the discharge wheel 81 by an adhesive remaining on the cover tape 13 while being discharged, the ends of the scrapers 91 and 92 can detach the cover tape 13 from the pressure wheel 83 or the discharge wheel 81. Therefore, the cover tape can be smoothly discharged.

According to the tape feeder of the chip mounter of the present invention, productivity of manufacture can be promoted due to a simple configuration for winding and discharging the cover tape, and the cover tape can be smoothly wound on a reel or discharged to the outside without malfunction.

As described above, the chip mounter tape feeder according to the present device is described by taking transfer of a chip mounter tape as an example, but the present device is not limited to the described embodiments and can be widely applied to various industrial-use machines for feeding parts in the form of tapes or strips.

What is claimed is:

1. A tape feeder of a chip mounter comprising:
   a frame;
   a transfer wheel rotatably installed on the frame and configured for intermittently transferring a chip tape by a predetermined length;
   a wheel member rotatably installed on the frame;
   a reel installed coaxially with the wheel member and configured for winding a cover tape separated from the chip tape around an outer circumference of the reel;
   a driving device having an actuator for driving a first link coupled to a second link which rotates the transfer wheel a predetermined amount in one direction; and
   a reverse rotation prevention member configured for preventing reverse rotation of the wheel member or the reel by frictionally contacting either the wheel member or the reel.

2. The tape feeder of a chip mounter as claimed in claim 1, wherein the reverse rotation prevention member comprises:
   a pivot lever whose one end is pivotally supported by the frame; and
   a friction wheel which is installed on the other end of the pivot lever so as to contact either the wheel member or the reel and configured to rotate in only a direction that is reverse to the direction of rotation of the wheel member or the reel.

3. The tape feeder of a chip mounter as claimed in claim 2, wherein the pivot lever further comprises a spring configured for elastically biasing the pivot lever so that the friction wheel can contact either the wheel member or the reel.

4. The tape feeder of claim 1, wherein the first link has a cam portion in operative engagement with a cam follower of the second link and the actuator is operatively connected to a first end of the first link.

5. The tape feeder of claim 1, wherein the driving device further comprises a pawl in operative engagement with the second link and elastically biased against a gripping portion of the transfer wheel.

6. The tape feeder of claim 1, wherein the driving device further comprises a pawl elastically biased against the wheel member.

7. The tape feeder of claim 1, wherein the outer circumference of the reel defines an flanged track portion for receiving the cover tape therein and the wheel member includes a outer circumferential tooth portion in frictional engagement with the reverse rotation prevention member.

8. The tape feed of claim 1, wherein the driving device further comprises a driving wheel having an annular protrusion in operative engagement with an annular groove of the wheel member.

9. A tape feeder of a chip mounter comprising:
   a frame;
   a transfer wheel rotatably installed on the frame for intermittently transferring a chip tape by a predetermined length;
   a wheel member rotatably installed on the frame;
   a reel installed coaxially with the wheel member for winding a cover tape separated from the chip tape;
   driving means for intermittently rotating the transfer wheel and the wheel member a predetermined amount in one direction;
   a reverse rotation prevention member for preventing reverse rotation of the wheel member or the reel by frictionally contacting either the wheel member or the reel; and
   wherein the driving means comprises:
      an actuator;
      a first link whose one end is connected to the actuator and the other end is pivotally coupled to the frame, and on which a cam portion is formed;
      a second link having a center rotatably coupled to the frame, and one end on which a cam follower interlocked with the cam portion is installed;
      a first latched pawl which is pivotally installed on the other end of the second link and elastically biased so that one end of the first latched pawl can mesh with at least one tooth of the transfer wheel; and
      a power switch unit interlocking with the pivoting of the second link for intermittently rotating the wheel member a predetermined amount.

10. The tape feeder of a chip mounter as claimed in claim 9, wherein the driving means further comprises:
    a third link having one end connected to the second link and configured for transmitting the rotational force of the second link;
    a fourth link combined with the other end of the third link;
    a V-shaped fifth link having one end coupled to the fourth link, and a center rotatably installed on the frame; and
    a spring configured for providing elastic force so that the fifth link can return to its original state after being rotated.

11. The tape feeder of a chip mounter as claimed in claim 10, wherein the power switch unit comprises:
    a sixth link configured for reciprocating in response to the rotation of the second link;
    a pivot link having one end fixed to the shaft of the wheel member, and the other free end coupled to the sixth link, which is configured for pivoting around the shaft of the wheel member in response to the reciprocation of the sixth link; and
    a second latched pawl installed on the free end of the pivot link, having one end engaged with at least one tooth of the wheel member.

12. The tape feeder of a chip mounter as claimed in claim 10, wherein the power switch unit comprises:
    a sixth link configured for reciprocating in accordance with the rotation of the second link;

an auxiliary link whose one end is connected to the sixth link; and a driving wheel which is installed on the other end of the auxiliary link so as to closely contact an outer circumference of the wheel member, and configured for rotating in only a direction that is opposite to the direction of rotation of the wheel member.

13. The tape feeder of a chip mounter as claimed in claim 12, wherein the power switch unit further comprises a spring for elastically biasing the driving wheel against the outer circumference of the wheel member.

14. A tape feeder of a chip mounter comprising:

a frame;

a transfer wheel rotatably installed on the frame and configured for intermittently transferring a chip tape by a predetermined length;

a driven wheel rotatably installed on the frame;

a discharge wheel installed coaxially with the driven wheel;

a driving wheel configured for contacting an outer circumferential surface of the driven wheel and intermittently rotating the driven wheel a predetermined amount of rotation in only one direction;

a pressure wheel configured for contacting an outer circumferential surface of the discharge wheel such that a cover tape separated from the chip tape is sandwiched between the pressure wheel and the discharge wheel so that the cover tape is discharged in response to the rotation of the driven wheel and the discharge wheel; and driving means configured for intermittently rotating the transfer wheel and the driving wheel a predetermined amount respectively in one direction.

15. The tape feeder of a chip mounter as claimed in claim 14, wherein the driving wheel and the pressure wheel are capable of rotating in only a direction that is opposite to the direction of rotation of the driven wheel.

16. The tape feeder of a chip mounter as claimed in claim 14, further comprising a winding prevention means configured for guiding a cover tape discharged from the space between the discharge wheel and the pressure wheel.

17. The tape feeder of a chip mounter as claimed in claim 16, wherein the winding prevention means includes scrapers installed so as to closely contact the outer circumferential surfaces of the discharge wheel and the pressure wheel.

* * * * *